United States Patent
Lassen

(10) Patent No.: US 10,298,189 B1
(45) Date of Patent: May 21, 2019

(54) ANALOG-TO-DIGITAL CONVERTER WITH AUTONOMOUS GAIN STAGE AND AUTO SCALING, AND RELATED SYSTEMS AND METHODS

(71) Applicant: Microchip Technology Incorporated, Chandler, AZ (US)

(72) Inventor: Jacob Lunn Lassen, Saupstad (NO)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 15/901,420

(22) Filed: Feb. 21, 2018

Related U.S. Application Data

(60) Provisional application No. 62/599,460, filed on Dec. 15, 2017.

(51) Int. Cl.
   *H03G 3/20* (2006.01)
   *H03M 1/10* (2006.01)

(52) U.S. Cl.
   CPC ............ *H03G 3/20* (2013.01); *H03M 1/1014* (2013.01)

(58) Field of Classification Search
   CPC ........ H03M 1/18; H03M 1/183; H03M 1/185; H03M 1/1014; H03G 3/20
   USPC .................................... 341/139, 155
   See application file for complete search history.

(56) References Cited

U.S. PATENT DOCUMENTS

| | | | | |
|---|---|---|---|---|
| 7,268,714 B2* | 9/2007 | Sherry | ................... | H03M 1/187 341/139 |
| 7,327,294 B2* | 2/2008 | Gierenz | .............. | H03M 1/0863 341/118 |
| 7,405,683 B1* | 7/2008 | Perrin | ................... | H03M 1/185 341/139 |
| 7,965,208 B2* | 6/2011 | McLoughlin | ......... | H03M 1/183 341/139 |
| 9,256,399 B2 | 2/2016 | Hanssen | | |

\* cited by examiner

*Primary Examiner* — Khai M Nguyen
(74) *Attorney, Agent, or Firm* — TraskBritt

(57) ABSTRACT

Embodiments of the disclosure relate to an analog-to-digital converter (ADC) with gain adjustment. One embodiment of an ADC with autonomous gain adjustment includes an ADC, a gain stage coupled to the ADC, a scaler coupled to the ADC, and a control logic that may be configured to configure the gain of the gain stage responsive to measured output of the ADC.

20 Claims, 7 Drawing Sheets

(State of the Art)

ANALOG-TO-DIGITAL CONVERTER WITH AUTONOMOUS GAIN STAGE AND AUTO SCALING, AND RELATED SYSTEMS AND METHODS

CROSS-REFERENCE TO RELATED APPLICATION

This application claims the benefit under 35 U.S.C. § 119(e) of U.S. Provisional Patent Application Ser. No. 62/599,460, filed Dec. 15, 2017, the disclosure of which is hereby incorporated herein in its entirety by this reference.

TECHNICAL FIELD

The embodiments of the present disclosure generally relate to signal processing, and more specifically, to analog-to-digital converters (ADC) that are used in applications that have a need for large dynamic signal range.

BACKGROUND

Many embedded applications read analog inputs and so have to convert those inputs to digital results. An ADC accepts an analog input signal (typically a voltage or a current), samples it, and converts each sample to a digital value that can be read, e.g., by a microcontroller, a microprocessor, a digital circuit, etc. Generally, the measurable output of an ADC is the (Vin/Vref)×Resolution. Resolution is a characteristic of an ADC, and may be expressed as the quantum of the input analogue voltage change required to increment an ADC's digital output from one value to the next higher code value. For example, the resolution of an 8-bit ADC may be expressed as one part in 255 or as 0.4% of full scale or simply as 8-bit resolution. So, if such an ADC has a full-scale analogue input signal range of 10 V then it may resolve a 40 mV change in input signal. The step size is the voltage difference between one digital level (i.e., 0001) and the next one (i.e., 0010 or 0000). For example, if an ADC has a step size of 40 mV, an input of 40 mV will produce an output in an 8-bit converter of 0000 0001.

Thus, to measure and convert small signal changes accurately, conventional ADCs use a higher resolution (i.e., capability to resolve a small mV change in input) while still being able to measure and convert large signal changes accurately (i.e., capability to resolve a larger mV change in input). For a conventional ADC that is expected to measure a wide dynamic range the measurements are relatively coarse when measuring small analog signals, that is the relative step size between each digital code is large when measuring small analog signals, while relatively fine when measuring large analog signals, that is the relative step size between each digital code is relatively small.

Many embedded applications that read an analog input signal require a large dynamic range and accurate measurements, that is, the ability to measure from a low voltage (e.g., the ground voltage) up to a high voltage (e.g., up to the system supply voltage)—while doing so accurately. For this reason, many applications need increasing ADC resolution. Conventional embedded applications typically, therefore, use a high-resolution ADC—e.g., 12-bit, 14-bit or higher— or an internal, programmable, gain stage for the ADC, so that small signals can be amplified as shown in FIG. 1.

BRIEF SUMMARY

Embodiments of the disclosure relate to a system. The system may include an amplifier, an analog-to-digital converter, a scaler, and a control circuit. The analog-to-digital-converter may have at least one input coupled to at least one output of the amplifier. The scaler may be coupled to at least one output of the analog-to-digital converter. The control circuit may be configured to: measure a signal level of an input signal at the analog-digital converter; and compare the measured signal level to a gain adjustment threshold. Responsive to the comparison, the control circuit may be configured to configure a gain of the amplifier; and configure a scaling component of the scaler, wherein the scaling component is proportional to the gain of the amplifier.

Other embodiments of the disclosure relate to a method. The method may include measuring a signal level of an input signal at an analog-to-digital converter; and comparing a measured signal level of the input signal to a gain adjustment threshold. Responsive to the comparison: configuring a gain of an amplifier operably coupled to the input of the analog-to-digital-converter; and configuring a scaling component of a scaler, wherein the scaling component is proportional to the gain of the amplifier.

Other embodiments of the disclosure relate to a system. The system may include and analog-to-digital converter, a gain stage, a scaler, and a control logic. The gain stage may be coupled to an input of the analog-to-digital converter. The scaler may be coupled to an output of the analog-to-digital converter. The control logic may be configured to: change a gain setting of the gain stage to keep an input to the analog-to-digital within a dynamic range of the analog-to-digital converter; and change a scaling setting of the scaler responsive on the changed gain setting.

BRIEF DESCRIPTION OF THE DRAWINGS

The purpose and advantages of the embodiments of the disclosure will be apparent to one of ordinary skill in the art from the summary in conjunction with the detailed description and appended drawings that follow.

DETAILED DESCRIPTION

Figure 1:
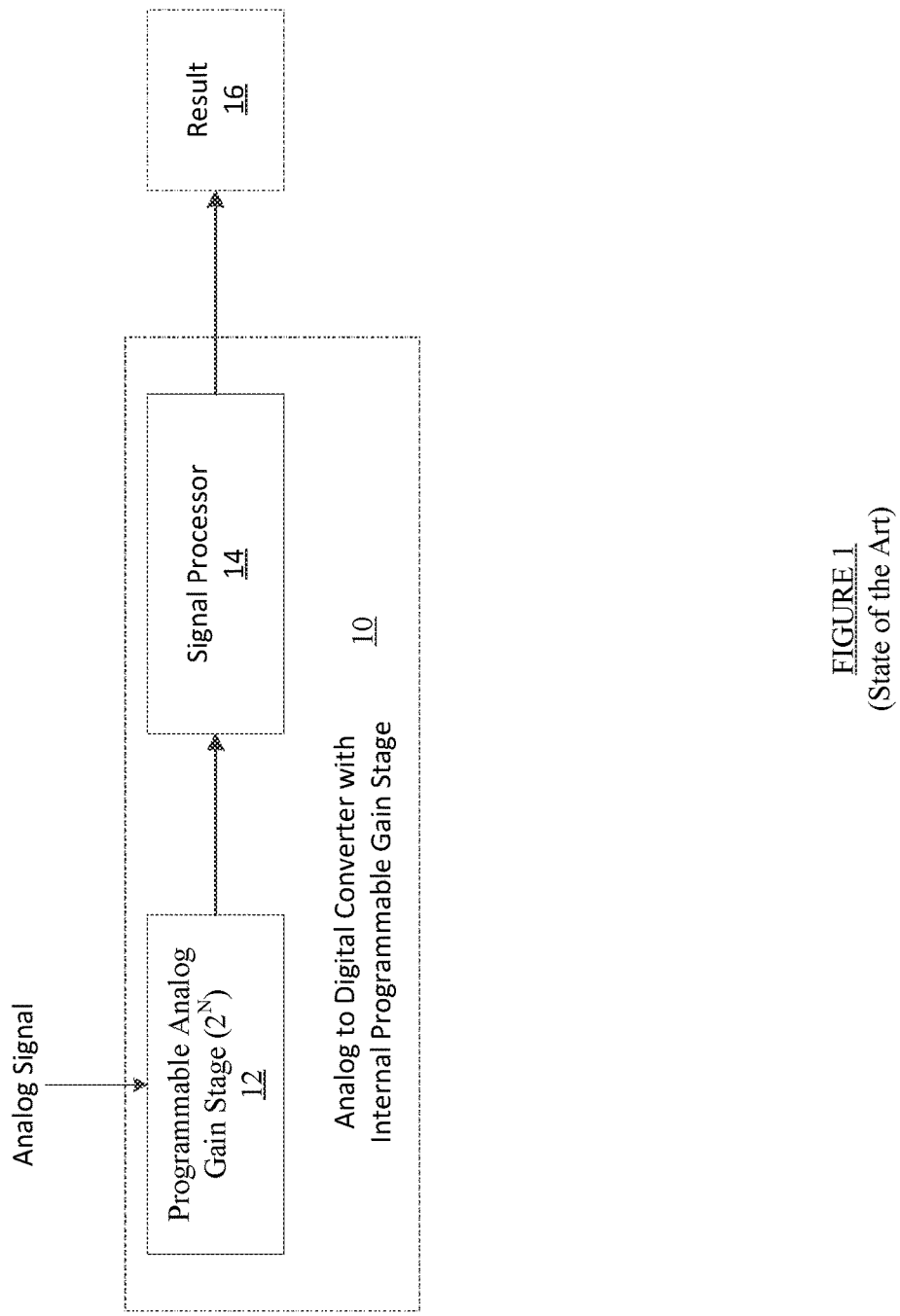
FIG. 1 shows an ADC with internal gain stage according to the state of the art.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure. The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, symbols, and chips that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the terms "automated," autonomous," or "auto" if used to describe a gain stage or scaling (e.g., "autonomous gain stage" or "auto scaling") means that the gain stage or scaling occurs without the supervision of a host processor. Accordingly, an ADC that incorporates an "autonomous gain stage" or "auto scaling," may, by way of example, be a core independent peripheral.

As used herein, the term "gain" is used generically to refer to the amplification, or reduction, of an input signal to respectively create a larger, or smaller, output signal proportional to the input signal. Thus, in the case of a reduction, gain may be considered a "fractional gain" where the output signal may be smaller than the input signal. Moreover, in cases where the gain is one, the output signal may match the input signal.

High resolution ADCs are expensive (cost), so it is desirable to use gain adjustment so that a lower resolution ADC may be used. One way to perform the gain adjustment is with software control (e.g., using a microcontroller's processor), however, it is now understood that performing gain under software control may introduces delays and interferes with sampling at a normal frequency. Thus, performing gain adjustment in software may not be practical for applications that require a high sample rate. Correcting these drawbacks adds complexity and further tradeoffs in terms of delay and computing power. By way of example, tracking the gain for each sample in software so that it can be later scaled down adds significant memory requirements.

Moreover, automated features that facilitate independent task completion without supervision by a CPU or other host are restrained by the software. Any application that incorporated an ADC with a software controlled gain stage would not be able to operate as a core independent peripheral.

Various embodiments of the disclosure relate, generally, to a system that includes an ADC, autonomous gain adjustment of the analog input signal to the ADC, and auto scaling of the ADCs result. A control circuit monitors the ADC and configures the autonomous gain adjustment of the analog input signal and auto scaling of the result. Such a system does not suffer the same delay and overhead drawbacks of conventional ADCs with internal gain stage or techniques that control the gain and scaling in software.

Figure 2:
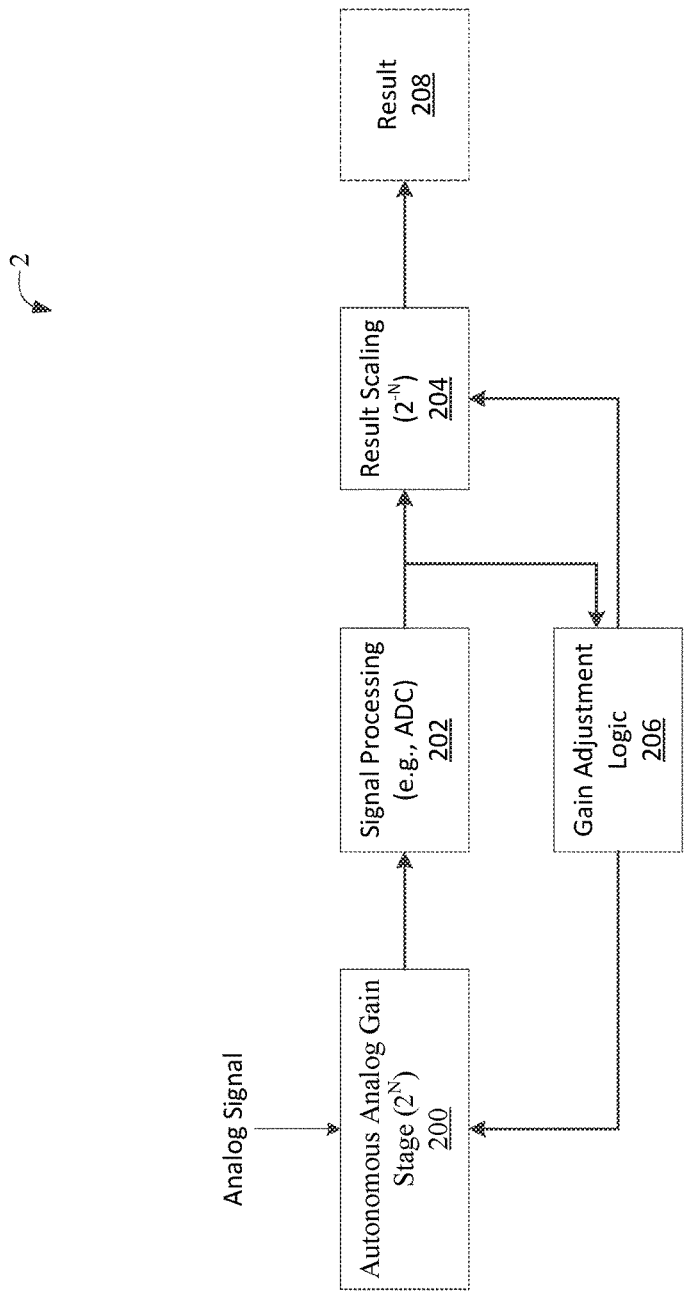
FIG. 2 shows functional blocks of an ADC with autonomous gain stage and gain adjustment, and auto scaling, in accordance with an embodiment of the disclosure.

FIG. 2 shows a functional block diagram of a system including an ADC 202 with an autonomous analog gain stage (AAGS) 200 and auto digital result scaling (ADRS) 204, in accordance with an embodiment of the disclosure.

The AAGS 200 may be configured to amplify (or reduce) an input analog signal according to a gain, and the amplified analog signal may be provided to the ADC 202. The gain of the AAGS 200 may be configurable. In one embodiment, a gain may be selected from among a number of gain options, e.g., select N, where, $2^N=2^{-2}, 2^{-1}, 2^0, 2^1, 2^2, 2^3, 2^4, 2^5$, or $2^6$ (N is limited only by the maximum gain available). In some embodiments, the gain options may be fractional in order to create a signal reduction, rather than a signal amplification.

The ADRS 204 may be configured to scale down (or up) a digital result, including a digital result received from the ADC 202, to obtain scaled result 208 shown in FIG. 2. The ADRS 204 may scale the digital result based on a scaling component, for example, a scaling component associated with a gain applied to the analog signal at an AAGS 200. In one embodiment, the ADRS 204 may scale a digital result proportionally to the gain applied to the analog input signal. If no gain is applied then, of course, the result is not scaled down responsive to a gain. In one embodiment (and most applications) the digital result is scaled to the assumed function of the ADC 202 (e.g., as provided in the ADCs specification), though in some applications a different scaling factor may be used. In one embodiment, the scaling component may be selectable from among a number of scaling options, e.g., select –N where, $2^{-N}=2^2, 2^1, 2^0, 2^{-1}, 2^{-2}, 2^{-3}, 2^{-4}, 2^{-5}$, or $2^{-6}$ (N is limited only by the maximum scaling available). In one embodiment, the scaling component or an indicator indicative of the scaling components is provided to the ADRS 204.

The gain adjustment logic 206 may be configured to monitor the input analog signal level, configure the amplification of the input analog signal, and configure the scaling of the digital result. In various embodiments, the gain adjustment logic 206 may be an analog or digital circuit. In analog embodiments the gain adjustment logic 206 may be, by way of non-limiting example, a threshold detection circuit. In digital embodiments the gain adjustment logic 206 may be, by way of non-limiting example, a configurable state machine coupled to memory, an FPGA, or another type of digital circuit. The gain adjustment logic 206 may be configured to compare the input analog signal level to a gain adjustment threshold. A gain adjustment threshold may be based on an ADC's dynamic range or a sub-range within an ADC's dynamic range. For example, the gain adjustment threshold may be defined as a sub-range within the dynamic range of an ADC selected to keep the analog input within a dynamic range of an ADC.

By way of non-limiting example, assume that the input of the ADC 202 is increasing from 50% of the ADC reference (i.e., in the middle of the dynamic range of the ADC 202) by 5% of the ADC reference per sample. In 10 samples the increase is 50%, which is added to the starting point which is 50% (of the dynamic range). So, at an $11^{th}$ sample, the ADC 202 would saturate as the input is 5% above the max limit that the ADC 202 can measure. If the gain adjustment logic 206 reduces the gain when the ADC 202 input reaches/passes a gain adjustment threshold then saturation may be avoided.

Continuing the non-limiting example, assume the gain adjustment threshold is set to 95% of the ADC reference, and the gain adjustment threshold is a threshold for an increasing signal. At sample number 9 the ADC 202 crosses the threshold and the gain adjustment logic 206 reduces the gain so that the analog signal is reduced by 50%, so (50%+45%)/2. After the signal is reduced, it is within the range defined by the gain adjustment threshold, which is 47.5% of the dynamic range. At 47.5% of the dynamic range the ADC 202 will not saturate if the input increases by 5%.

By way of another example, if the input of the ADC 202 increases in steps of 20% of the ADC reference per sample, then the ADC input reaches 90% after 2 samples and saturates on the $3^{rd}$ sample (110%). In one embodiment, the input change rate may be used to set a gain adjustment threshold, for example, if the input changes at a rate up to 20% of the dynamic range per sample, then the gain adjustment threshold may be set to 75% or lower (75%+20=95% or just below the saturation limit). In embodiments where the gain adjustment logic 206 is a digital circuit, for example, a configurable state machine with memory—the gain adjustment logic 206 may configure the gain based on, at least in part, a digital result, or parts of a digital result. In another embodiment the gain adjustment logic 206 may be an analog circuit. Thus, depending on the implementation, the feedback to the gain adjustment logic 206 may be either analog or digital, and the gain adjustment logic 206 may be either analog, digital, or a mix of analog and digital.

Figure 3:
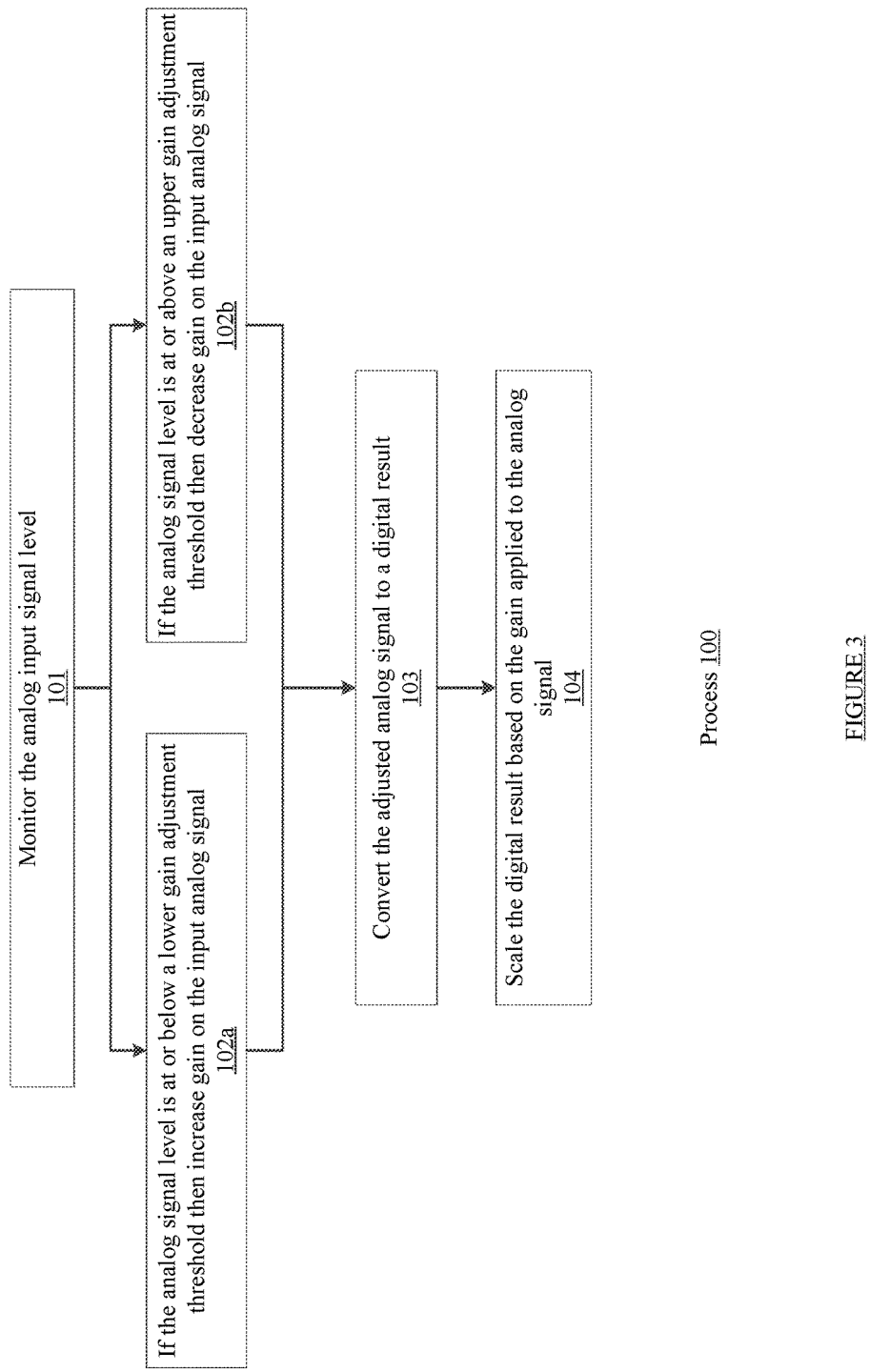
FIG. 3 shows an autonomous gain adjustment process in accordance with an embodiment of the disclosure.

In one embodiment, the gain adjustment logic 206 may be configured to determine a gain by solving for the gain that would result in the monitored analog signal level being close to the reference level of the ADC 202 and to configure the AAGS 200 to use that determined gain. The gain adjustment logic 206 may be configured to provide a scaling component to the ADRS 204 based on a gain. In one embodiment, the scaling component may be based on a determined gain. In one embodiment, the gain adjustment logic 206 may be configured to solve for 'Gain' in Equation 1:

$$\left(\frac{\text{Analog signal level} \times \text{Gain}}{ADC \text{ reference}} \times \text{Digital } ADC \text{ resolution}\right) \times \text{Result scaling} =$$
Digital result FIG. 3 shows an autonomous gain adjustment process 100, in accordance with an embodiment of the disclosure. The autonomous gain adjustment process 100 may be performed in conjunction with a system 2 (FIG. 2), in accordance with embodiments of the disclosure. An input signal level is observed, in operation 101. If the input signal level is at or crosses below a lower gain adjustment threshold then the gain is increased on the input signal, in operation 102a. If the input signal level is at or crosses above an upper gain adjustment threshold then the gain is decreased on the input signal, in operation 102b. In various embodiments, a gain may be selected from among available/optional gains, where the selected gain provides an adjusted input signal level that is well within an ADC's dynamic range. The adjusted input signal is converted to a digital result, in operation 103. The digital result is scaled down based on the gain applied to the analog signal, in operation 104.

Notably, in the autonomous gain adjustment process 100 the adjusted analog signal may have the same level as the input signal if the gain is =1x. If the gain applied to the adjusted input signal is =1x then the digital result will not be scaled down.

Figure 4:
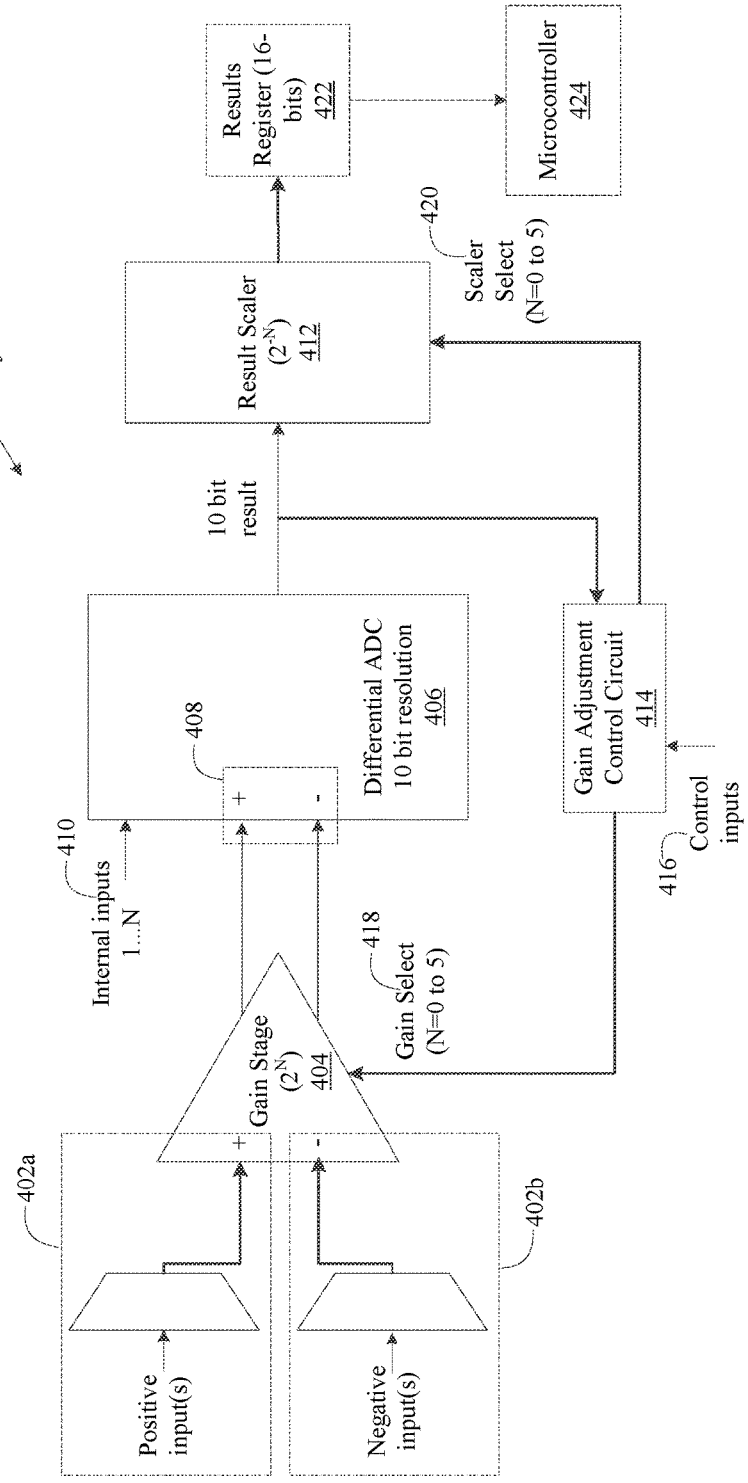
FIG. 4 shows an implementation of an ADC circuit with autonomous analog gain stage and auto digital result scaling, in accordance with an embodiment of the disclosure.

FIG. 4 shows an implementation of an analog to digital convert with autonomous gain stage and gain adjustment, in accordance with embodiments of the disclosure. The differential ADC 406 is a 10-bit ADC coupled to gain stage 404; however, one of ordinary skill in the art will understand that any resolution ADC may be used. In another embodiment the differential ADC 406 may be a multi-stage pipelined ADC. The ADC 406 is a differential ADC that includes a differential input 408 (e.g., negative and positive), and for single-ended measurements a negative input of the differential input 408 of the ADC may be coupled to a fixed internal value. In another embodiment, a single ended ADC may be used. The differential ADC 406 may support other functions, including functions that do not use gain, and thus a gain enablement may be included (not shown). The differential ADC 406 may include a number of internal inputs 410, including a voltage reference (Vref), and may include additional internal inputs—e.g., a temperature sensor.

In one embodiment, a gain adjustment control circuit 414 may be coupled to the differential ADC 406, gain stage 404 and result scaler 412 and configured to monitor the result output from the differential ADC 406 and to configure a gain select 418 of the gain stage 404 and a scaler select 420 of the result scaler 412. The gain adjustment control circuit 414 may include one or more control inputs 416 to configure the operation of the gain adjustment control circuit 414. In one embodiment, the gain adjustment control circuit 414 is a configurable state machine with memory.

In one embodiment, the gain stage 404 may be configured to directly amplify an analog input signal, and may be or may include, for example, one or more operational amplifiers. The gain stage 404 may include differential inputs 402a and 402b, for example, receiving positive inputs and negative inputs.

The result register 422 may be a 16-bit register coupled to the result scaler 412. When the 10-bit differential ADC 406 has unity gain (x1) its maximum value will use all bits in the result register 422, which, in this example, is 16 bits. The lower 4 bits are not used for unity gain. However, if the analog signal level is at or below a lower gain adjustment threshold then the gain may be autonomously increased (e.g., doubled), and the digital result scaled down accordingly to compensate for the analog gain. Further, if the analog signal level is at or above an upper gain adjustment threshold then the gain may be autonomously decreased (e.g., halved), and the digital result scaled down accordingly to compensate for any analog gain (unless the gain=1x in which case the digital result is not scaled down).

The result register 422 may be coupled to, accessible by, or part of a microcontroller 424 with integrated non-volatile memory. Multiple inputs of the microcontroller 424 may incorporate an analog to digital converter with autonomous gain stage and gain adjustment. In one embodiment, the microcontroller 424 includes one or more peripherals that incorporate an analog to digital converter with autonomous gain stage and gain adjustment in accordance with embodiments of the disclosure.

Figure 5:
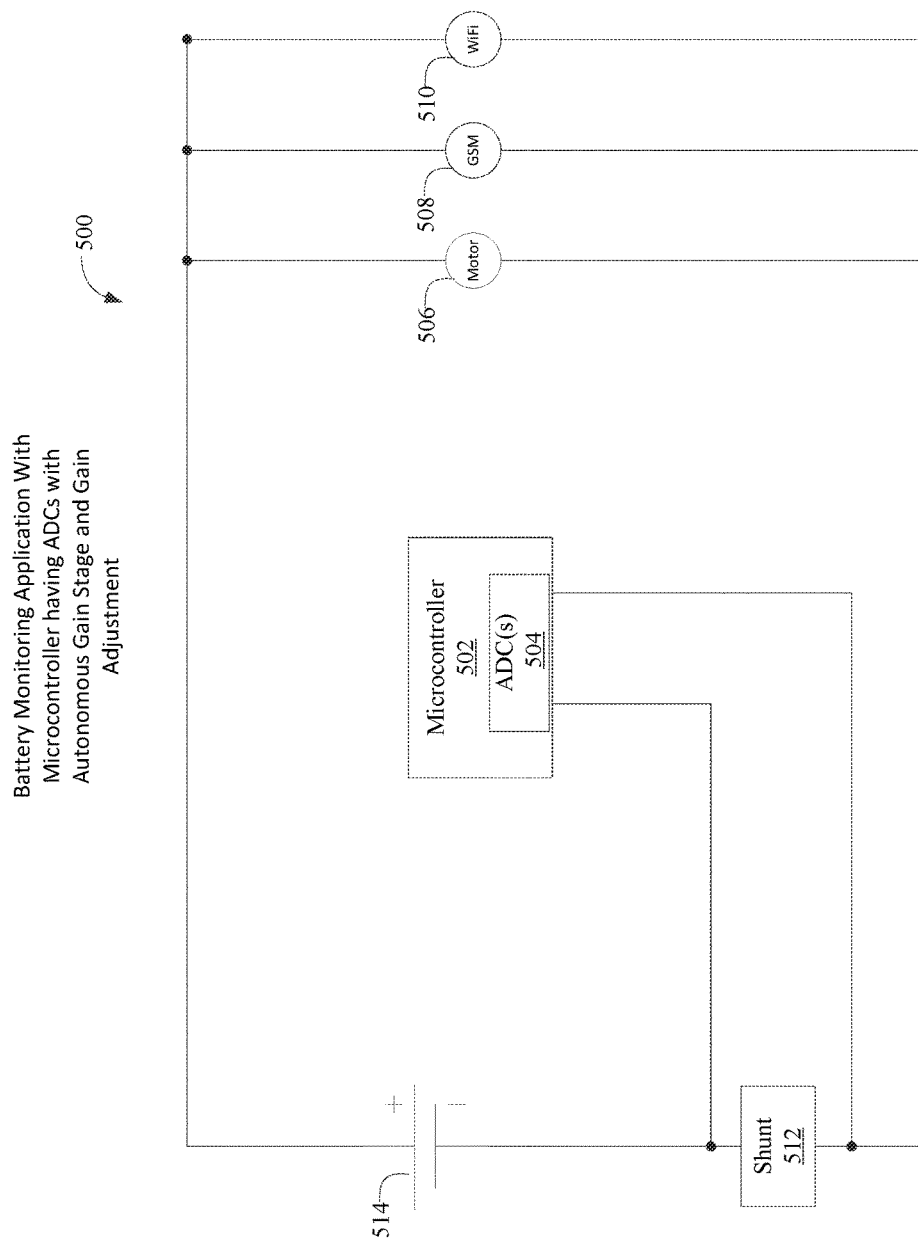
FIG. 5 shows an exemplary process of monitoring a battery that incorporates an ADC circuit with autonomous analog gain stage and auto digital result scaling, in accordance with embodiment of the disclosure.

FIG. 5 shows a battery monitoring system 500 having an embedded microcontroller 502 that performs a battery monitoring application, wherein the embedded microcontroller 502 incorporates an ADC(s) 504 with autonomous gain stage and gain adjustment, in accordance with embodiments of the disclosure. FIG. 5 shows embedded microcontroller 502 operatively coupled to terminals on either side of shunt 512. The embedded microcontroller 502 is configured to measure the current into, and out of, a battery 514 and estimate the remaining the battery life or provide the measurements to a software application that estimates remaining battery life. The embedded microcontroller 502 may be configured to measure current into and out of a motor 506, a GSM (global system for mobile communication) connected actuator 508, and a WiFi antenna 510 in a drone. One of ordinary skill in the art will recognize that the embedded microcontroller 502 that incorporates ADCs 504 with autonomous gain adjustment may be incorporated into any device that has power consuming components that are sensitive to battery life, for example, a mobile phone (e.g., antenna, display), a drone (e.g., motor, GSM connected actuator), a pace maker or other medical device (e.g., electrical impulse generator), etc.

Figure 6:
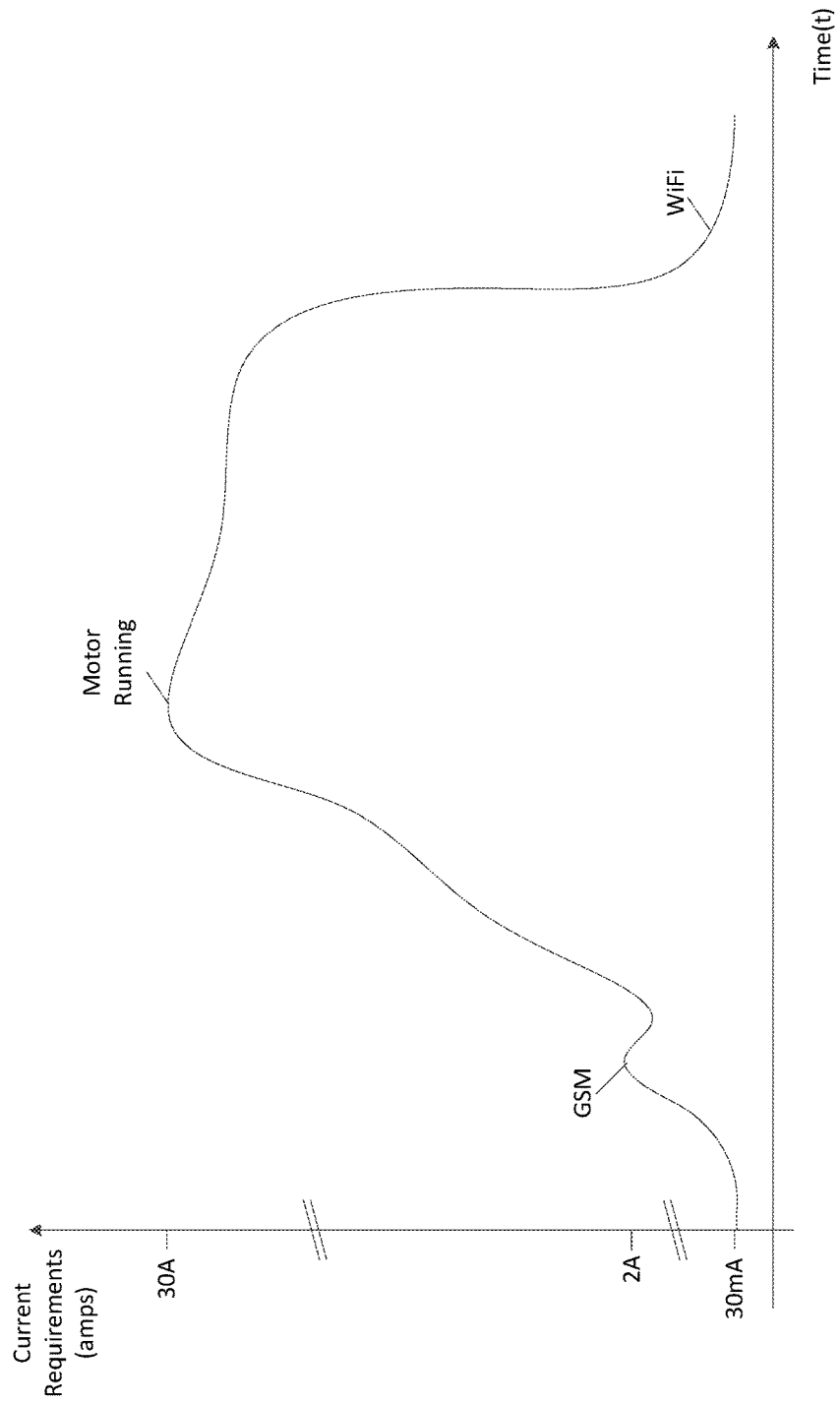
FIG. 6 shows an analog signal from the system of FIG. 5.

FIG. 6 shows the dynamic range within which the embedded microcontroller 502 and associated ADC 504 operate in the battery monitoring system of FIG. 5. A typical standby current for a motor 506 may be 30 mA and the max current during high power consumption by a motor 506 may be 30 A. For a GSM connected actuator 508 the current when the GSM is active may be around 2 A. For the WiFi antenna 510 the current when the antenna is active is about 30 mA. So, the dynamic range within which the embedded microcontroller 502 operates may be about 30 mA to 30 A.

Figure 7A:
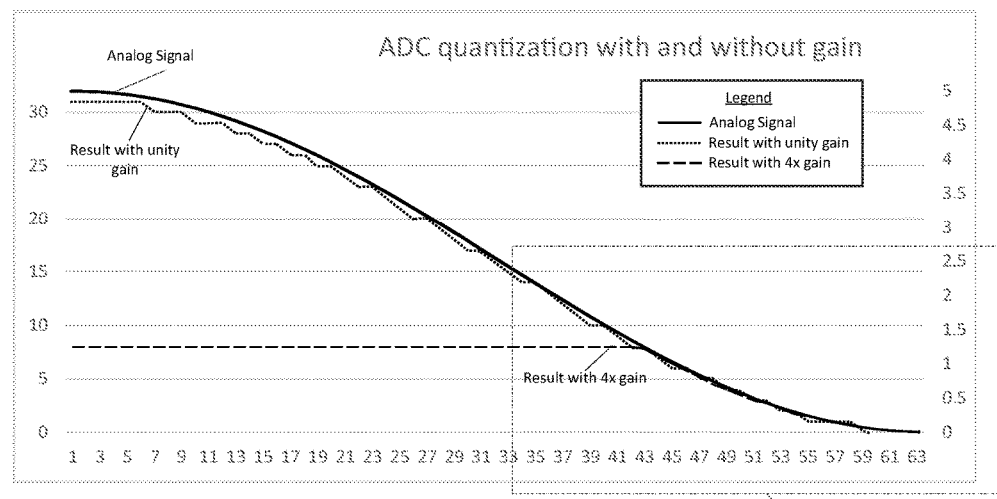
FIGS. 7A and 7B shows an example of a gain adjustment process in accordance with an embodiment of the disclosure.
Figure 7B:
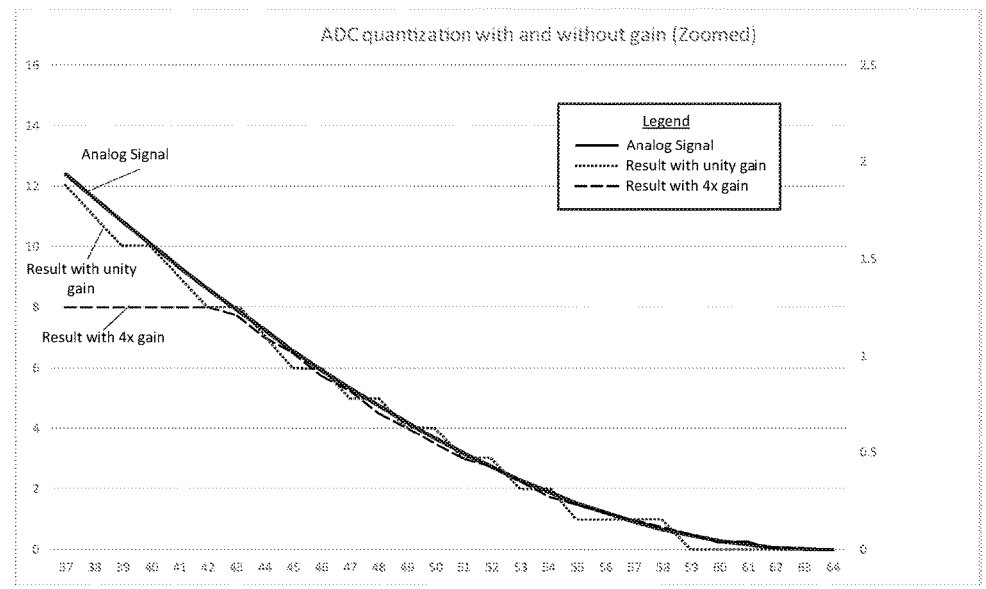

FIGS. 7A and 7B shows an example of a gain adjustment process in accordance with an embodiment of the disclosure. To measure and monitor the battery the optimal resolution is about 1 mA or better, thus, there would be 30,000 steps in the 30 mA to 30 A range. However, the ADC 504 is a 12-bit ADC and has 4,096 steps, so the resolution at unity gain is rather coarse compared to the analog signal.

As shown in FIG. 7B, when the gain adjustment starts about time slot 43, a 4x gain is applied which enables the ADC 504 to measure signal resolution down to about 1.25 mA while still being able to measure up to 30 A. A 64x gain would enable the ADC 504 to measure the signal resolution down to about 100 uA while still being able to measure up to 30 A.

One of ordinary skill in the art will recognize many advantages and benefits from the embodiments described herein, including over conventional ADCs with internal programmable gain stages.

One advantage of an ADC with AAGS and ADRS is that that ADC's are typically calibrated and optimized to an input signal level at or near a reference signal level. Thus, an ADC with AAGS and ADRS operates under ideal conditions for measuring the signal at any given time, providing high quality resolution and dynamic resolution.

One advantage of an ADC with AAGS and ADRS is the adjustment of the gain of the AAGS cycle by cycle without involving a CPU at a signal level. If an input signal level is high (i.e., at the upper end of the dynamic range of the ADC) then the ADC with AAGS will automatically reduce the gain, and if the signal level is low (i.e., at the lower end of the dynamic range of the ADC) then it will automatically increase the gain.

One of ordinary skill in the art will understand that the principles described herein are applicable to, and may be implemented in, digital-to-analog converters.

In one embodiment, the ADC with AAGS and ADRS is incorporated as a core independent peripheral of a microcontroller. In one embodiment the ADC with AAGS and ADRS may be coupled to an event system bus. Additional details regarding one type of event system and event bus, as well as overall microcontroller system configurations, may be found in U.S. Pat. No. 9,256,399 entitled "BREAKING PROGRAM EXECUTION ON EVENTS" filed on Jun. 27, 2013, the disclosure of which is incorporated herein in its entirety by this reference.

Many of the functional units described in this specification may be illustrated, described or labeled as modules, threads, or other segregations of programming code, in order to more particularly emphasize their implementation independence. Modules may be at least partially implemented in hardware, in one form or another. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

Additional non-limiting embodiments of the disclosure include:

Embodiment 1, a battery monitoring system, comprising: at least one load; at least one battery, an embedded device configured to measure current requirements of the at least one load; and a battery monitoring unit configured to determine a forecast of battery charge responsive to measured current requirements of the at least one load, wherein the embedded device comprises an analog-to-digital converter having autonomous gain stage adjustment.

Embodiment 2, the battery monitoring system of embodiment 1, wherein the analog-to-digital converter having autonomous gain stage adjustment comprises: an analog-to-digital converter, a gain stage, and a control circuit configured to measure out of the analog-to-digital converter and configure the gain stage responsive to detecting that an input signal is at a gain adjustment threshold, the gain adjustment threshold is within a pre-defined number of steps of at least one limit of a dynamic range of the analog-to-digital converter.

Embodiment 3, the battery monitoring system of embodiment 2, wherein each step of the predefined number of steps is a voltage difference between a digital level and a next digital level.

Embodiment 4, a mobile phone comprising a battery monitoring system according to embodiments 1 to 3.

Embodiment 5, an automobile driving system comprising a battery monitoring system according to embodiments 1 to 3.

Embodiment 6, a drone comprising a battery monitoring system according to embodiments 1 to 3.

What is claimed is:

1. A system, comprising:
an amplifier;
an analog-to-digital-converter having at least one input coupled to at least one output of the amplifier;
a scaler coupled to at least one output of the analog-to-digital converter; and
a control circuit, the control circuit configured to:
configure a gain of the amplifier and a scaling component of the scaler for increasing an effective resolution of the analog-to-digital converter;
measure a signal level of an_input signal at the analog-to-digital converter;
detect that increasing the signal level by a step size of the analog-to-digital converter would meet or exceed a gain adjustment threshold;
configure the gain of the amplifier responsive to an adjusted gain selected such that an adjusted input signal level at the analog-to-digital converter is substantially at ½ of a reference voltage of the analog-to-digital converter; and
configure the scaling component of the scaler responsive to an adjusted scaling component that is proportional to the adjusted gain.

2. The system of claim 1, wherein the control circuit is configured to compare the measured signal level to a lower gain adjustment threshold.

3. The system of claim 2, wherein the control circuit is configured to configure the gain of the amplifier to be greater responsive to the measured signal level being equal to or less than the lower gain adjustment threshold.

4. The system of claim 1, wherein configuring the gain of the amplifier comprises providing an indication of a gain selection from among a number of optional gains.

5. The system of claim 1, wherein configuring the scaling component of the scaler comprises providing an indication of a scaler component from among a number of optional scaler components.

6. The system of claim 1, further comprising a result register configured to receive a down scaled digital result from the scaler.

7. The system of claim 6, further comprising a microcontroller configured to read the result register.

8. The system of claim 7, wherein the system is an embedded system.

9. The system of claim 1, wherein measuring the signal level of the input signal at the analog-digital converter comprises measuring the level of a digital signal measured at an output of the analog-to-digital converter.

10. The system of claim 1, wherein the control circuit is a digital control circuit.

11. The system of claim 1, wherein the control circuit is an analog control circuit.

12. The system of claim 1, wherein the gain of the amplifier is a closed loop gain.

13. The system of claim 12, wherein the closed loop gain G satisfies the expression $-1<G<1$.

14. The system of claim 12, wherein the closed loop gain G satisfies the expression $G\leq-1$ and $1\leq G$.

15. The system of claim 1, wherein the control circuit is configured to measure one or more of an input or an output of the analog-to-digital converter and measure the input signal of the analog-to-digital converter responsive to the measured output.

16. A method, the method comprising: measuring a signal level of an amplified input signal at an analog-to-digital converter;
    detecting that increasing the signal level by a step size of an analog-to-digital converter would meet or exceed a gain adjustment threshold;
    configuring a gain of an amplifier operably coupled to the input of the analog-to-digital converter responsive to an adjusted gain selected such that an adjusted input signal level at the analog-to-digital converter is substantially at ½ of a reference voltage of the analog-to-digital converter; and
    configuring a scaling component of a scaler operably coupled to an output of the analog-to-digital converter responsive to an adjusted scaling component that is proportional to the adjusted gain.

17. A system, comprising:
    an analog-to-digital-converter;
    a gain stage coupled to an input of the analog-to-digital converter, wherein the gain stage is a differential amplifier;
    a scaler coupled to an output of the analog-to-digital converter;
    a control unit configured to:
        change a gain setting of the differential amplifier responsive to an indication that a change in amplitude of an input to the analog-to-digital converter equal to a step size of the analog-to-digital converter may be outside a dynamic range of the analog-to-digital converter; and
        change a scaling setting of the scaler responsive to the changed gain setting; and
    a microcontroller comprising at least one peripheral having the analog-to-digital converter, the gain stage, the scaler, and the control unit.

18. The system of claim 17, wherein the control unit is a configurable state machine.

19. The system of claim 17, wherein the control unit is further configured to measure the input to the analog-to-digital converter from a reference point, wherein the reference point is 50% of the dynamic range of the analog-to-digital converter.

20. The system of claim 17, wherein the control unit is further configured to change the scale setting of the scaler based on a determined gain.

* * * * *

UNITED STATES PATENT AND TRADEMARK OFFICE
CERTIFICATE OF CORRECTION

PATENT NO. : 10,298,189 B1
APPLICATION NO. : 15/901420
DATED : May 21, 2019
INVENTOR(S) : Jacob Lunn Lassen Page 1 of 1

It is certified that error appears in the above-identified patent and that said Letters Patent is hereby corrected as shown below:

In the Claims

Claim 1, Column 10, Line 32, change "of an_input signal" to --of an input signal--

Signed and Sealed this
Ninth Day of July, 2019

Andrei Iancu
*Director of the United States Patent and Trademark Office*